United States Patent [19]
Kawai et al.

[11] Patent Number: 4,903,104
[45] Date of Patent: Feb. 20, 1990

[54] HETEROJUNCTIONAL COLLECTOR-TOP TYPE BI-POLAR TRANSISTOR

[75] Inventors: Hiroji Kawai, Kanagawa; Kenichi Taira, Tokyo, both of Japan

[73] Assignee: Sony Corporation, Tokyo, Japan

[21] Appl. No.: 376,904

[22] Filed: Jul. 5, 1989

Related U.S. Application Data

[63] Continuation of Ser. No. 110,836, Oct. 21, 1987, abandoned.

[30] Foreign Application Priority Data

Oct. 29, 1986 [JP] Japan .................................. 61-257293

[51] Int. Cl.⁴ ............................................ H01L 29/72
[52] U.S. Cl. ........................................ 357/35; 357/34; 357/16
[58] Field of Search ................ 357/34, 16, 34 HB, 46, 357/36, 58, 35

[56] References Cited

U.S. PATENT DOCUMENTS 4,712,121 12/1987 Yokoyama ......................... 357/34 X
4,739,379 4/1988 Akagi et al. ....................... 357/34 X

FOREIGN PATENT DOCUMENTS 59-208873 11/1984 Japan .............................. 357/34 HB
61-19167 1/1986 Japan .............................. 357/34 HB

*Primary Examiner*—William Mintel
*Attorney, Agent, or Firm*—Hill, Van Santen, Steadman & Simpson

[57] ABSTRACT

A heterojunction type bi-polar transistor which has a heterojunction in the boundary between an intrinsic base region and an external base region to thereby eliminate the periphery effect and accordingly obtain a high current amplification factor.

1 Claim, 6 Drawing Sheets

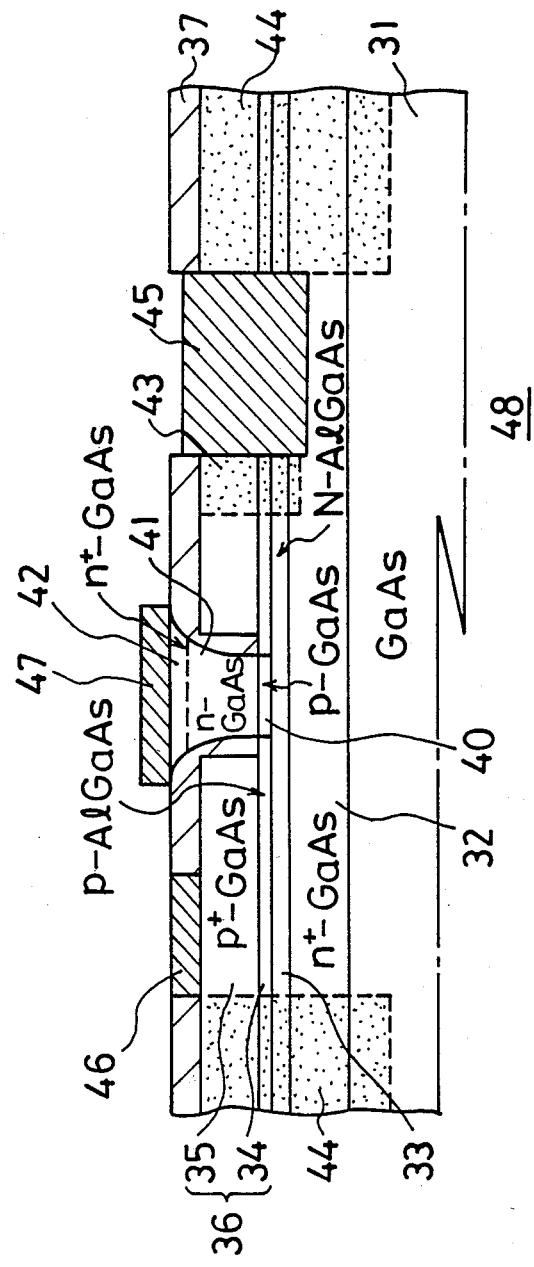

HETEROJUNCTIONAL COLLECTOR-TOP TYPE BI-POLAR TRANSISTOR

This is a continuation of application Ser. No. 110,836, filed 10/21/87, now abandoned.

BACKGROUND OF THE INVENTION

FIELD OF THE INVENTION

This invention relates to a heterojunction type bi-polar transistor.

DESCRIPTION OF THE PRIOR ART

The hererojunction type bi-polar transistor can overcome defects inherent to the homojunction bi-polar type transistors made of silicon.

To specifically explain the advantage of, for example, a hererojunction type transistor using AlGaAs for its emitter (E) and GaAs for its base (B) and collector (C) given as an example, the hole or the majority carrier in the base cannot be diffused into the emitter due to an energy barrier produced by a band gap different ($\Delta Eg$) between E and B, so that a base current is decreased and an injection efficiency of electrons from the emitter to the base is increased. It is therefore possible to increase the amplification factor ($\beta = I_C/I_B$) even though a base concentration is set at a high value and an emitter concentration at a low value. This means that a base resistance and a junction capacitance between E and B, which relate to the operating speed of the device, can be decreased. It is theoretically and experimentally approved that the heterojunction bi-polar transistor can operate at a higher speed than a silicon bi-polar transistor.

FIG. 1 shows a typical structure of an AlGaAs/-GaAs planar type heterojunction bi-polar transistor manufactured by using ion implantation and metal burying technologies, An example of manufacturing process of a transistor 13 having such a structure will be briefly explained as follows.

As shown in FIG. 1, on a semi-insulating GaAs substrate 1, there are epitaxially deposited successively an n+-GaAs layer which is to serve as a collector electrode leading layer 2, an n-GaAs layer which is to serve as a collector region 3, a p-GaAs layer which is to serve as a base region (intrinisc base region) 4, an N-AlGaAs layer which is to serve as an emitter region 5, and n-GaAs and n+-GaAs layers which are to serve as a cap layer 6. Then, the cap layer 6 made of n+-GaAs is removed by etching so as to leave the emitter region 5. Next, Mg is implanted with an $SiO_2$ layer used as a mask, and thereafter an external base layer 7 is formed by annealing. Further, an element isolation region 8 and a base/collector isolation region 9 are respectively formed by implanting boron or H+ ions thereinto. Finally, a portion of a $SiO_2$ layer 10 corresponding to a collector electrode forming region is removed to form an opening or window, a trench (groove portion) 11 is formed, and metal 12 is buried into the trench 11, to thereby manufacture the transistor 13. In the drawing, reference numeral 14 designates a base electrode, 15 an emitter electrode, and 16 a collector electrode, respectively.

There has also been proposed a so-called collector-top type heterojunction bi-polar transistor 17 which has its collector region on the top surface thereof, as shown in FIG. 2. The manufacturing process of the collector-top type heterojunction bi-polar transistor is almost the same as that of the emitter-top type heterojunction bi-polar transistor 13 as shown in FIG. 1, with the only exception being that the order of the epitaxial growth is changed. In FIG. 2, the parts corresponding to those in FIG. 1 are designated by the same reference numerals. Reference numeral 18 designates an n+-GaAs layer which is to serve as an emitter electrode leading layer, and 19 an n+-GaAs layer which is to serve as a collector cap layer.

The switching time $\tau s$ of a heterojunction bi-polar transistor is given by the following equation:

$$s = 5\ Rb\ Cc/2 + Rb \cdot \tau b/R_L + (3Cc + C_L)\ R_L$$

Where Rb is a base resistance, Cc a junction capacitance between the base and the collector, $R_L$ a load resistance, $C_L$ a load capacitance, a $\tau b$ a base passing time.

It will be understood from the above equation that decrease in Rb and Cc is necessary to decrease $\tau b$. It is generally thought that the collector-top type heterojunction bi-polar transistor can advantageously decrease Cc in comparison with the emitter-top type heterojunction bi-polar transistor, so that the collector-top type can operate at a higher speed than the emitter-top type. Let it be explained hereinafter in detail.

(i) In the collector-top type heterojunction bi-polar transistor, the collector area is narrow so that the junction capacitance between the collector and the base is reduced, which is advantageous for higher speed operations. On the other hand, the emitter area is wide so that the junction capacitance between the emitter and the base is increased. This is a disadvantage. However, the junction between the emitter and the base is a heterojunction which is smaller than that of the homojunction. Furthermore, since the emitter concentration is low, the emitter junction capacitance can be inherently made small so that it will not produce grave problems. Advantages derived from decreasing the collector capacitance is far greater than the disadvantage due to the increase in the junction capacitance between the emitter and the base. The previously proposed heterojunction bi-polar transistors show that the collector-top type operates at a speed higher than the emitter-top type.

(ii) As to the circuit configuration, the emitter coupled logic (ECL) has the gates formed by connecting the emitters of several transistors in common so that the element dimension can be decreased by making the n+ emitter layer common without isolation.

However, the collector-top type heterojunction bi-polar transistor as shown in FIG. 2 has defects as follows:

(i) When the element is made small, the current amplification factor is decreased by a so-called periphery effect which is produced such that electrons implanted from the emitter region 5 to the base region (intrinsic base region) 4 and existing in a periphery are diffused by the diffusion length (several $\mu m$) to the external base region 7 and combined with the holes.

(ii) The external base region 7 is formed by implanting Mg ions into the collector region made of the n-GaAs layer 3 and annealing. Since the n-GaAs layer of the collector region 3 is of a low concentration in the order of $10^{16} cm^{-3}$, the implantation of the high concentration Mg ions and annealing cause a diffusion in the horizontal direction, whereby the collector dimension becomes unstable or the collector region may disappear in the worst case. Accordingly, the collector dimension must be made relatively large by the process rule and hence the collector cannot be made small (approximately 1 μm) with stability. Neither can the junction capacitance between the collector and the base be completely eliminated.

(iii) The wide gap junction between the external emitter and the external base is also formed by implanting Mg ions and annealing. If the diffusion in the vertical direction is large, it may occur that the implanted ions penetrate the N-AlGaAs emitter region 5. To avoid the penetration, the emitter region 5 of the low concentration N-AlGaAs layer must be made thick, which results in increase in the emitter resistance and a lower operation speed.

OBJECTS AND SUMMARY OF THE INVENTION

In view of the problems mentioned above, it is an object of the present invention to provide a hetrojunction type bi-polar transistor having a high current amplification factor by eliminating the periphery effect.

To achieve the above object, the present invention provides a heterojunction type bi-polar transistor in which an emitter region, a base region and a collector region are formed on a compound semiconductor substrate, characterized by inserting a heterojunction to form a boundary between an intrinsic base region formed on the base region and an external base region.

These and other objects, feature and advantages of the present invention will become apparent from the following detailed description of the preferred embodiment taken in conjunction with the accompanying drawings, throughout which like reference numerals designate like elements and parts.

BRIEF DESCRIPTION OF THE DRAWINGS

FIGS. 3A—3E are diagrams showing manufacturing processes of an embodiment according to the present invention.

DESCRIPTION OF THE PREFERRED EMBODIMENTS

An embodiment of a collector-top type heterojunction bi-polar transistor according to the present invention will hereinafter be described with reference to FIGS. 3A-3E together with its manufacturing process.

Figure 1:
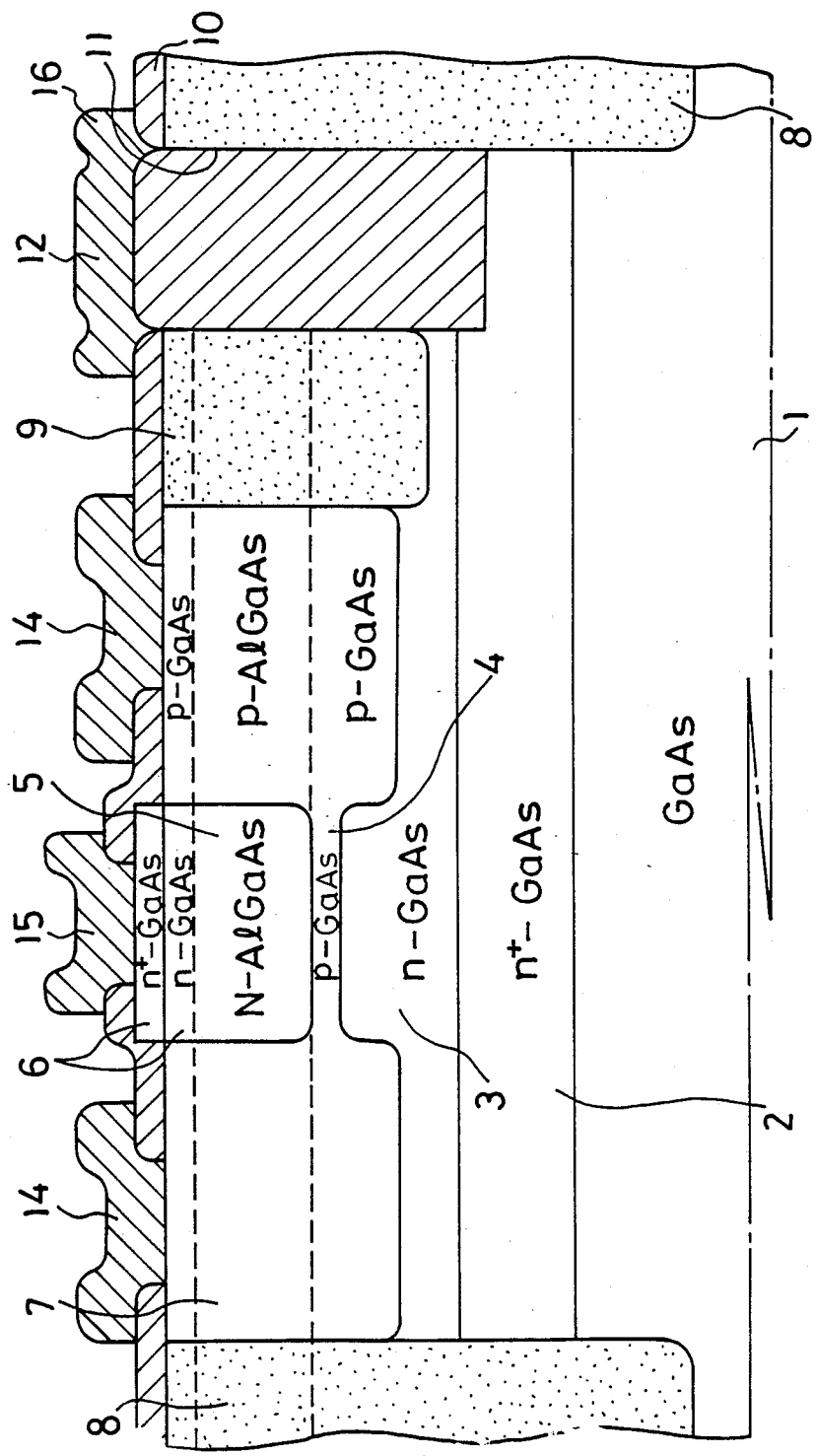
FIG. 1 is a cross-sectional view showing a conventional emitter-top heterojunction type bi-polar transistor.
Figure 2:
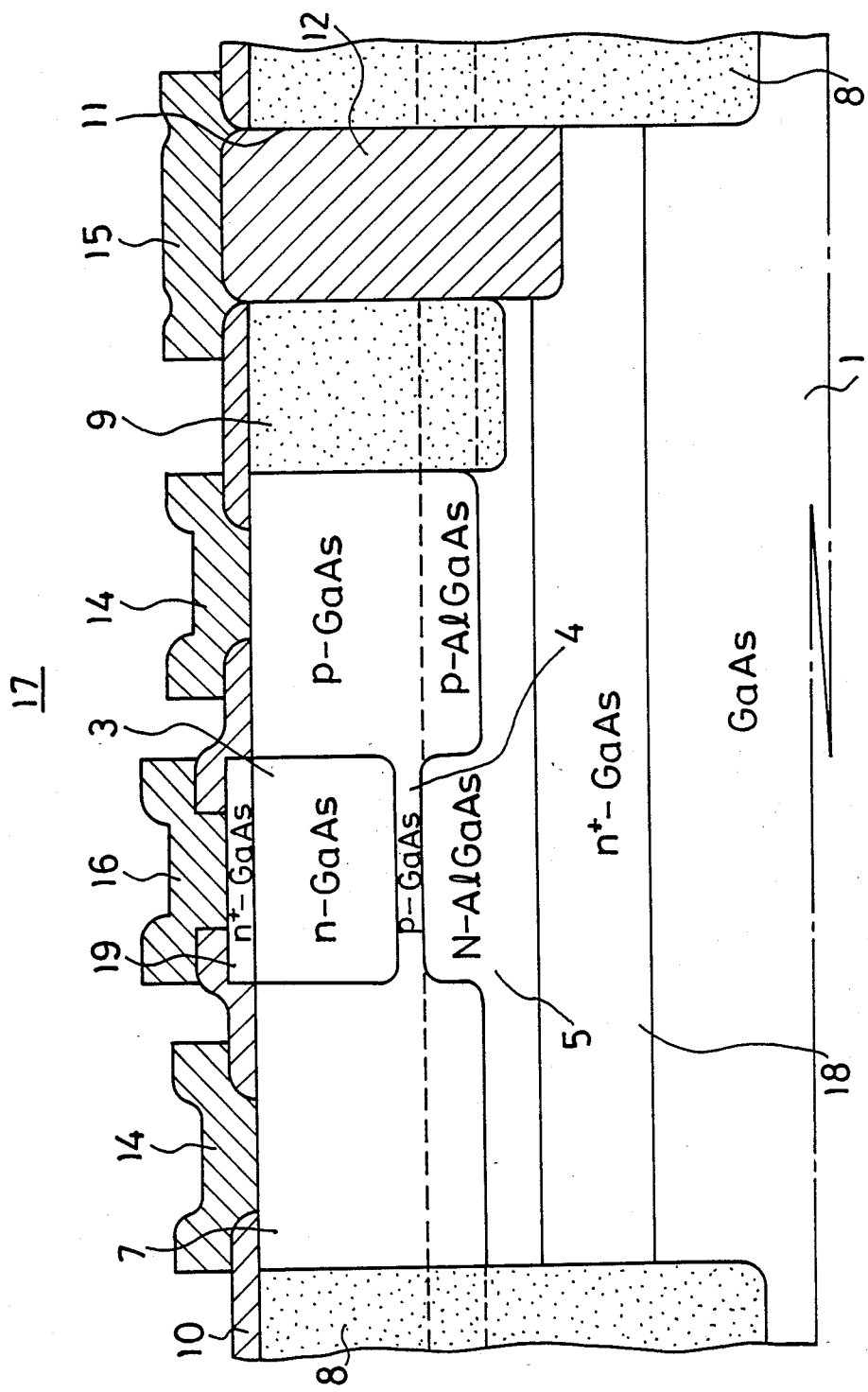
FIG. 2 is a cross-sectional view showing a conventional collector-top hetrojunction type bi-polar transistor.
Figure 3A:
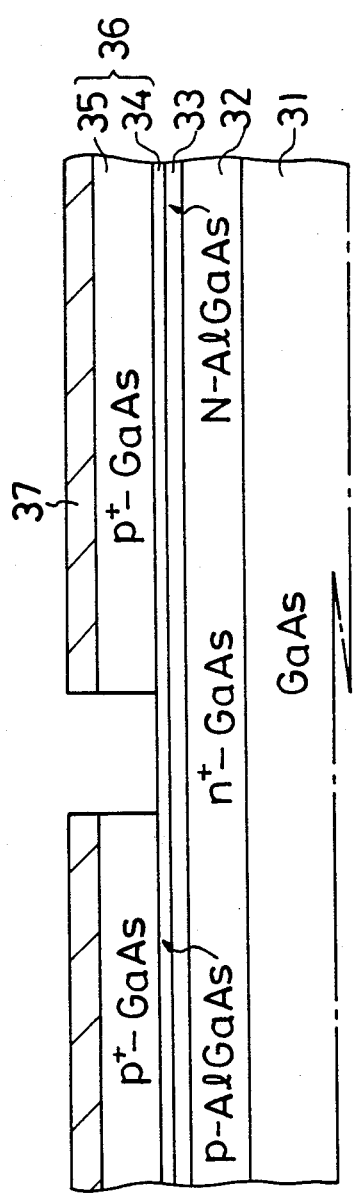

Referring first to FIG. 3A, on a semi-insulating GaAs substrate 31 there are successively grown by the metal organic vapor deposition (MOCVD) method an n+-GaAs layer with the thickness of 0.5 μm and having the impurity concentration of approximately $3 \times 10^{18} cm^{-3}$ which is to serve as an emitter electrode leading layer 32, an N-Al$_{0.3}$Ga$_{0.7}$As layer with the thickness of 0.2 μm and having the impurity concentration of approximately $5 \times 10^{17} cm^{-3}$ which is to serve as an emitter region 33, a P-Al$_{0.3}$Ga$_{0.7}$As layer with the thickness of 0.1 μm and having the impurity concentration of approximately $5 \times 10^{18} cm^{-3}$ which is to serve as a blocking layer 34 (forming a portion of an external base region 36), and a p+-GaAs layer 35 with the thickness of 0.5 μm and having the impurity concentration of approximately $1 \times 10^{19} cm^{-3}$ which forms a portion of the external base region 36. Then, on the p+-GaAs layer 35 a Si$_3$N$_4$ layer 37 is deposited by the sputtering or chemical vapor deposition (CVD) method. Next, a portion of the Si$_3$N$_4$ layer 37 corresponding to a collector region to be later formed is removed by photolithography techniques to form an opening therethrough. The p+-GaAs layer 35 is selectively removed by etching with the Si$_3$N$_4$ layer 37 using as a mask to form a recess 38.

Figure 3B:
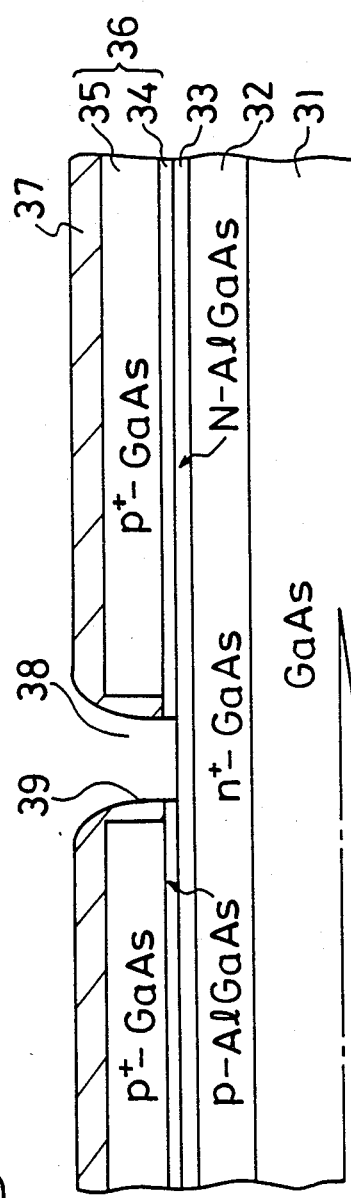

Next, as shown in FIG. 3B, a side wall 39 of Si$_3$N$_4$ is formed on the side faces of the p+-GaAs layer 35 in the recess 38. The side wall 39 is formed by first depositing the Si$_3$N$_4$ layer all over the surface including the recess 38 and then effecting anisotropy etching, for example, reactive ion etching (RIE). The p-AlGaAs layer 34 on the bottom of the recess 38 is selectively removed e.g. by wet etching with the side wall 39 using as a mask.

Figure 3C:
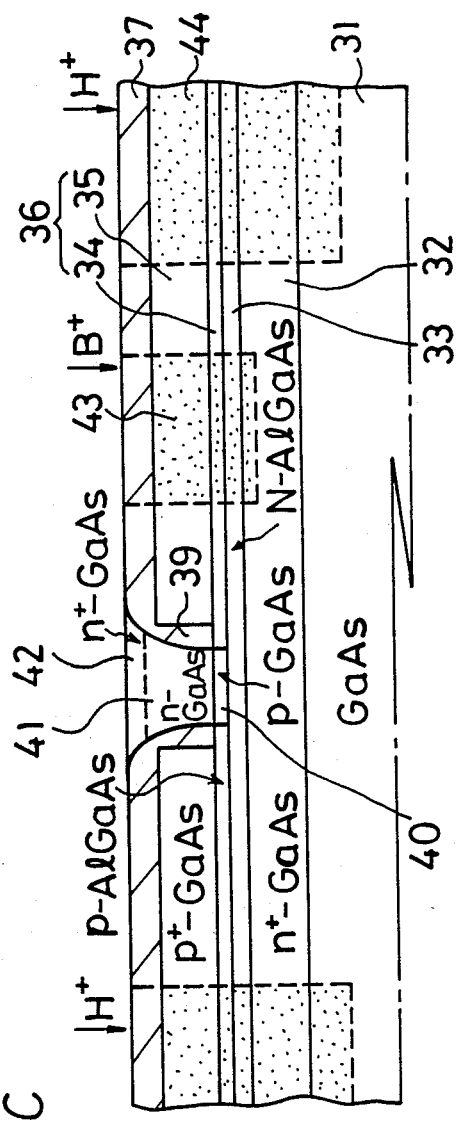

Next, as shown in FIG. 3C, an intrinsic base region 40 made of p+-GaAs which has the thickness of 0.1 μm and the impurity concentration of $5 \times 10^{18} cm^{-3}$, a collector region 41 made of n-GaAs which has the thickness of 0.6 μm and the impurity concentration of $5 \times 10^{16} cm^{-3}$, and a cap layer 42 made of n+- GaAs which has the thickness of 0.1 μm and the impurity concentration of $5 \times 10^{18} cm^{-3}$ are grown in the recess 38 by the selective MOCVD method. In this epitaxial growth, GaAs·is never grown on the Si$_3$N$_4$ layer 37. Thereafter, B+ or H+ ions are implanted to form an emitter/base isolating region 43 and an element isolating ragion 44 by the insulation.

Figure 3D:
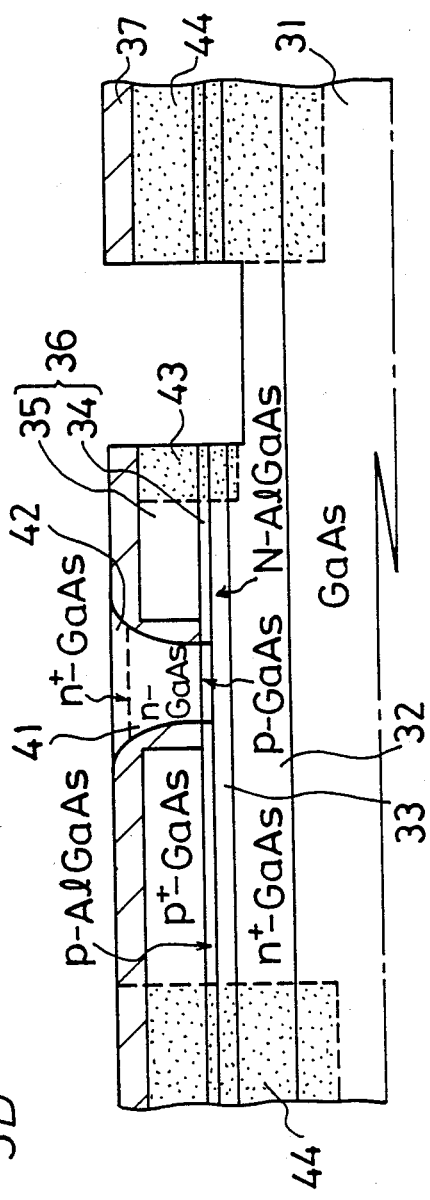

Next, a portion of the Si$_3$N$_4$ layer 37 corresponding to an emitter electrode forming region is removed to form an opening to thereby form a trench (groove portion), and then a metal, for example Au/Ge is buried in the trench to form an emitter electrode 45 (refer to FIGS. 3D and 3E). Another portion of the Si$_3$N$_4$ layer 37 corresponding to a base electrode forming region is removed to form an opening and then a base electrode 46 is made of Ti/Pt/Au (non alloy). Further, on the cap layer 42 a collector electrode 47 made of Au/Ge/Ni (alloy) is formed to finally complete a collector-top type heterojunction bi-polar transistor 48 as shown in FIG. 3E.

The collector-top type heterojunction bi-polar transistor constructed as described above has advantages as follows:

Since the ion implantation and annealing are not used for forming the external base region 36 and the P-AlGaAs/N-AlGaAs junction (the junction between the p-AlGaAs block layer 34 and the N-AlGaAs emitter region 33), the structure and characteristics of the device will not be varied and a good reproductivity can be obtained. Particularly, the collector dimension coincides with the design value. The collector region 41 has a size determined by a lithography rule. It is also possible to make the collector region 41 smaller than the size determined by the lithography rule.

The collector region 41 and the p-GaAs layer 35 which serves as the external base region are isolated from each other by the isulating layer, namely the side wall made of Si$_3$N$_4$ which has a dielectric constant smaller than that of the GaAs, so that the external junction capacitance between the collector and the base becomes small enough to be ignored, in comparison with that of the intrinsic region.

Further, the boundary between the intrinsic base region 40 and the external base region or the block layer 34 is formed of a p-GaAs/P-AlGaAs heterojunction structure so that electrons implanted from the emitter region 33 to the intrinsic base region 40 cannot be diffused into the external base region 36. This means that loss of the electrons in the periphery is eliminated (the periphery effect is avoided). Therefore, even if the active region is reduced to be several $\mu$m, and even in a low current region, a high current amplification factor ($\beta = I_C/I_B$) can be obtained. Since the p-GaAs layer 35 which is to serve as the external base region is formed of p-GaAs, whose impurity concentration is more than $10^{19} cm^{-3}$, the external base resistance is largely reduced. Since the external base region 36 is formed by the MOCVD method, the external base region never penetrates the wide-gap emitter region, as is the case with the conventional ion implantation and annealing methods. It is therefore possible to reduce the thickness of the emitter region 33 of low concentration N-AlGaAs, in comparison with previously proposed ones, and thereby decrease the emitter resistance.

As described above, the capacitance Cc between the base and the collector can be reduced in the extreme and the base resistance Rb can be also largely reduced, so that higher speed operations are available and the periphery effect can be avoided, whereby a high current amplification factor is available even to an element of a length being approximately 1 $\mu$m.

Figure 4:
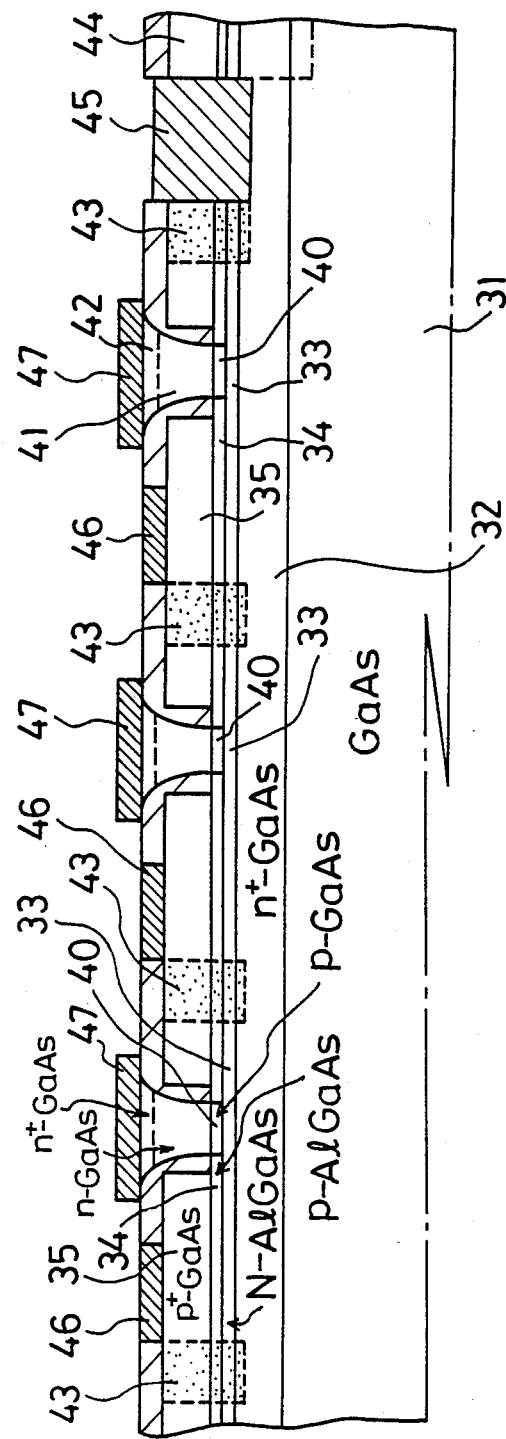
FIG. 4 is a cross-sectional view showing another embodiment of the present invention.

FIG. 4 shows another embodiment in which the present invention is applied to a circuit configuration formed of a plurality of transistors which have the emitters connected in common. The manufacturing method thereof is the same as that for the above-mentioned first embodiment. The parts corresponding to those in FIG. 3 are designated by the same reference numerals and the explanation thereof will be omitted.

According to the present invention, the so-called periphery effect, i.e. the recombination of carriers implanted from the emitter region to the intrinsic base region in the periphery can be avoided in the heterojunction type bi-polar transistor by inserting the heterojunction in the boundary between the intrinsic base region and the external base region. It is therefore possible to provide a heterojunction type bi-polar transistor which has a high current amplification factor, even though the transistor is of a small size.

The above description is given on preferred embodiments of the invention but it will be apparent that many modifications and variations could be effected by one skilled in the art without departing from the spirits or scope of the novel concepts of the invention so that the scope of the invention should be determined by the appended claims only.

We claim as our invention:

1. A transistor, said transistor formed as a heterojunction collector-top type bi-polar transistor, said transistor having an emitter region, intrinsic and external base regions, and a collector region formed on a compound semiconductor substrate, and a heterojunctin structure forming a boundary between said intrinsic base region formed adjacent said external base region, wherein said transistor has a substrate, an emitter region formed on said substrate, and a collector region formed on top of said emitter region, said intrinsic base region formed between said emitter and collector regions.

* * * * *